US008028255B2

(12) United States Patent
Satoi et al.

(10) Patent No.: US 8,028,255 B2
(45) Date of Patent: Sep. 27, 2011

(54) SEMICONDUCTOR INTEGRATED CIRCUIT, SEMICONDUCTOR INTEGRATED CIRCUIT DESIGN SUPPORT DEVICE, AND SEMICONDUCTOR INTEGRATED CIRCUIT MANUFACTURING METHOD

(75) Inventors: Tomoki Satoi, Kanagawa (JP); Naohiko Nishigaki, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 87 days.

(21) Appl. No.: 12/035,281

(22) Filed: Feb. 21, 2008

(65) Prior Publication Data
US 2008/0222592 A1    Sep. 11, 2008

(30) Foreign Application Priority Data
Mar. 8, 2007    (JP) .................................. 2007-058884

(51) Int. Cl.
*G06F 17/50*    (2006.01)

(52) U.S. Cl. ...................................... 716/100

(58) Field of Classification Search ................. 716/1, 10, 716/100
See application file for complete search history.

(56) References Cited

U.S. PATENT DOCUMENTS

| 5,696,771 | A  | * | 12/1997 | Beausang et al. | ............. | 714/726 |
|-----------|----|---|---------|-----------------|--------------|---------|
| 6,067,650 | A  | * | 5/2000  | Beausang et al. | ............. | 714/726 |
| 6,237,122 | B1 | * | 5/2001  | Maki            | ............. | 714/730 |
| 6,539,536 | B1 | * | 3/2003  | Singh et al.    | ............. | 716/102 |
| 6,675,364 | B1 | * | 1/2004  | Basto et al.    | ............. | 716/6   |
| 6,691,268 | B1 | * | 2/2004  | Chin            | ............. | 714/726 |
| 7,055,118 | B1 | * | 5/2006  | Kamepalli et al.| ............. | 716/107 |
| 7,729,898 | B1 | * | 6/2010  | Lytle           | ............. | 703/26  |
| 2004/0015803 | A1 | * | 1/2004  | Huang et al.  | ............. | 716/10  |
| 2004/0119496 | A1 | * | 6/2004  | Park et al.   | ............. | 326/40  |
| 2005/0235185 | A1 | * | 10/2005 | Campbell      | ............. | 714/726 |
| 2005/0283691 | A1 | * | 12/2005 | Chae          | ............. | 714/726 |
| 2006/0253753 | A1 | * | 11/2006 | Gunda et al.  | ............. | 714/726 |
| 2008/0134107 | A1 | * | 6/2008  | Wang et al.   | ............. | 716/2   |
| 2008/0195991 | A1 | * | 8/2008  | Duewer et al. | ............. | 716/12  |

FOREIGN PATENT DOCUMENTS

JP    2004-233084    8/2004

* cited by examiner

*Primary Examiner* — Jack Chiang
*Assistant Examiner* — Suchin Parihar
(74) *Attorney, Agent, or Firm* — Dickstein Shapiro LLP

(57) ABSTRACT

A semiconductor integrated circuit including a user logic circuit is disclosed in which circuit parts for shifting data are composed of registers other than scan cells except for the circuit part right after a combinational circuit, and the parts configured of the registers other than the scan cells are used as a scan path.

5 Claims, 7 Drawing Sheets

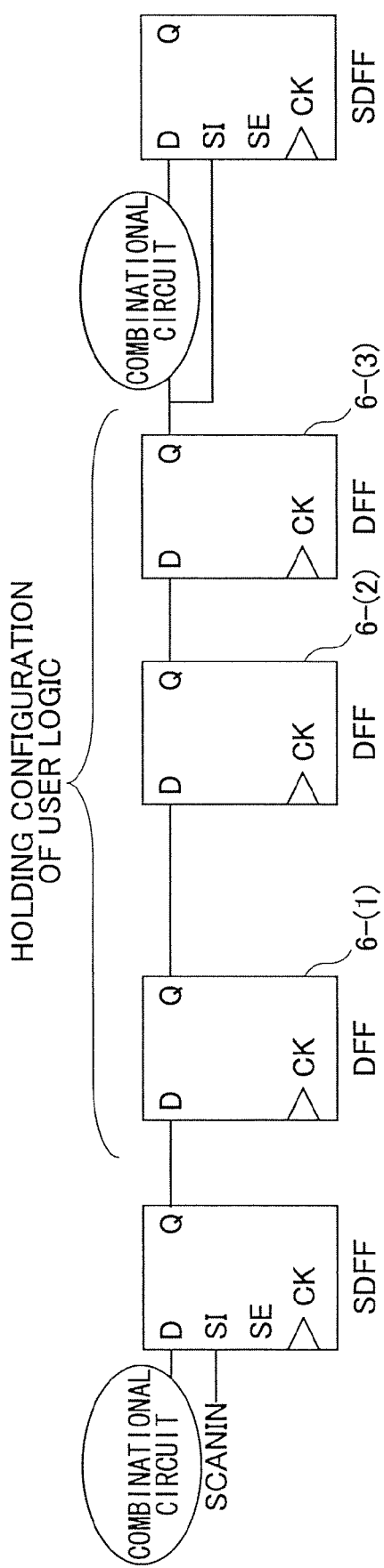

SEMICONDUCTOR INTEGRATED CIRCUIT, SEMICONDUCTOR INTEGRATED CIRCUIT DESIGN SUPPORT DEVICE, AND SEMICONDUCTOR INTEGRATED CIRCUIT MANUFACTURING METHOD

BACKGROUND OF THE INVENTION

1. Field of the Invention

The present invention relates generally to semiconductor integrated circuits, semiconductor integrated circuit design support devices, and semiconductor integrated circuit manufacturing methods and, in particular, to a semiconductor integrated circuit having a design for testability, a semiconductor integrated circuit design support device, and a semiconductor integrated circuit manufacturing method.

2. Description of the Related Art

Semiconductor integrated circuits are generally provided with scan cells for conducting a scan test. Taking, for example, in MUX (multiplex) scan cells, a multiplexer is inserted so that a data input of a normal flip-flop is switched to a scan input using a scan enable signal as one of the selectable signals. Then, the areas of the scan cells become large, resulting in set-up timing being messed up.

As scan path designs, there are a full scan design and a partial scan design. The full scan design is a design in which all or most of the flip-flops of target sequence circuits are made into scan cells and a shift register configuration is structured in the scan cells. The partial scan design is a design in which some flip-flops of target sequence circuits are made into scan cells and the shift register configuration is structured in the scan cells.

Generally, the full scan design is more excellent than the partial scan design in controllability and observability relative to a circuit as well as in failure detection rate by a scan/ATPG test.

Recently, with scaling-up and high integration of semiconductor integrated circuits and an improvement in operating frequency, problems have emerged such as increased chip area, increased power consumption, degraded timing convergence, and degraded wiring convergence of layouts, which are caused by the scan designs. Conventionally, in order to cope with these problems, the scan rate is lowered by using the partial scan design to prevent an increase in chip area, degraded timing, and degraded wiring convergence. However, taking such a measure will disadvantageously sacrifice a high failure detection rate.

Note that Patent Document 1 discloses a scan test method for semiconductor integrated circuits of high integration and a semiconductor integrated circuit tested by the scan test method.

Patent Document 1: JP-A-2004-233084

SUMMARY OF THE INVENTION

In conventional scanning techniques, failure detection rates may be reduced if their scan rates are lowered. In view of this, it is an object of the present invention to manufacture a semiconductor integrated circuit capable of maintaining a high failure detection rate even if the scan rate is lowered, while reducing the trend toward increased chip areas, increased power consumption, degraded timing convergence, and degraded wiring convergence of layouts by lowering the scan rate.

The present invention has been made in order to solve the above problem. According to an aspect of the present invention, there is provided a semiconductor integrated circuit including a user logic circuit, wherein circuit parts for shifting data are composed of registers other than scan cells except for the circuit part right after a combinational circuit, and the parts configured of the registers other than the scan cells are used as a scan path.

Preferably, the semiconductor integrated circuit further comprises a control circuit that causes the parts configured of the registers used as the scan path to perform a scan operation.

According to another aspect of the present invention, there is provided a semiconductor integrated circuit design support device. The device comprises a read unit configured to read netlist data; an extraction unit configured to extract a sequence circuit part capable of shifting data, the extraction unit extracting from the read netlist data the sequence circuit part capable of similarly performing a normal operation and a scan operation; an insertion unit configured to insert a control circuit that causes the extracted sequence circuit part capable of shifting data to perform the scan operation; a first scan unit configured to make other sequence circuit parts in the read netlist data into scan cells while maintaining the extracted sequence circuit parts capable of shifting data if the netlist data read by the read unit are data before insertion of the scan cells, thereby structuring a scan path while maintaining a user logic circuit; a second scan unit configured to restore all or a part of the extracted sequence circuit parts capable of shifting data to flip-flops if the netlist data read by the read unit are data after the insertion of the scan cells, thereby structuring the scan path while maintaining the user logic circuit; and an output unit configured to output the netlist data.

Preferably, the extraction unit configured to extract the sequence circuit part capable of shifting data includes a longest-path extraction unit configured to extract a longest path for shifting data in a netlist.

According to still another aspect of the present invention, there is provided a semiconductor integrated circuit manufacturing method, wherein circuit parts for shifting data are composed of registers other than scan cells except for the circuit part right after a combinational circuit, and the parts configured of the registers other than the scan cells are used as a scan path.

Preferably, the semiconductor integrated circuit manufacturing method further comprises providing a control circuit that causes the parts configured of the registers used as the scan path to perform a scan operation.

According to yet another aspect of the present invention, there is provided a semiconductor integrated circuit manufacturing method. The method comprises a read step of reading netlist data; an extraction step of extracting a sequence circuit part capable of shifting data, the extraction step extracting from the read netlist data the sequence circuit part capable of similarly performing a normal operation and a scan operation; an insertion step of inserting a control circuit that causes the extracted sequence circuit part capable of shifting data to perform the scan operation; a first scan step of making other sequence circuit parts in the read netlist data into scan cells while maintaining the extracted sequence circuit parts capable of shifting data if the netlist data read by the read unit are data before insertion of the scan cells, thereby structuring a scan path while maintaining a user logic circuit; a second scan step of restoring all or a part of the extracted sequence circuit parts capable of shifting data to flip-flops if the netlist data read by the read unit are data after the insertion of the scan cells, thereby structuring the scan path while maintaining the user logic circuit; and an output step of outputting the netlist data.

Preferably, the extraction step of extracting circuit parts capable of shifting data includes a longest-path extraction step of extracting a longest path for shifting data in a netlist.

According to the embodiments of the present invention, it is possible to design a scan path without increasing the area of a semiconductor integrated circuit and messing up set-up timing. Furthermore, it is not necessary to take a measure for failure detection for a redundant circuit part as typically found in scanning relative to the configuration of shift registers, thereby simplifying a scan design.

Furthermore, it is possible to structure a scan path without making as many flip-flops as possible into scan cells, thereby designing the scan path while preventing an increase in entire area of a semiconductor integrated circuit. Moreover, it is possible to prevent an increase in chip area, increased power consumption, degraded timing convergence, and degraded wiring convergence of layouts, which are the problems caused by conventional scan designs.

Other objects, features and advantages of the present invention will become more apparent from the following detailed description when read in conjunction with the accompanying drawings.

BRIEF DESCRIPTION OF THE DRAWINGS

FIG. 1C shows an example logic circuit diagram designed by a semiconductor integrated circuit designing method (manufacturing method) according to a first embodiment of the present invention;

DETAILED DESCRIPTION OF THE PREFERRED EMBODIMENTS

Referring to the accompanying drawings, a description is now made of preferred embodiments of the present invention.

First Embodiment

Figure 1A:
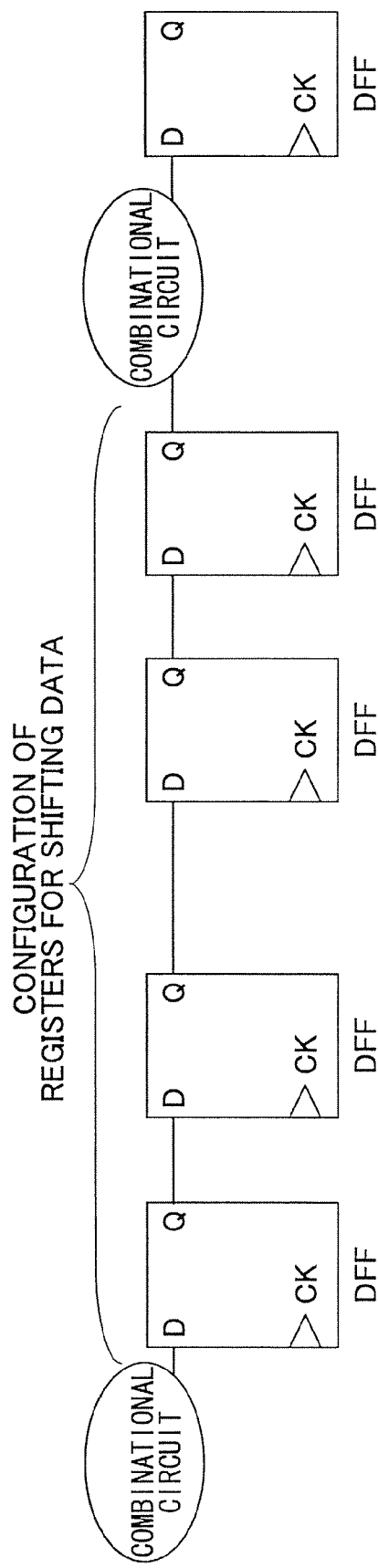
FIG. 1A shows an example of a general logic circuit particularly including a part configured of registers for shifting data, representing a schematic circuit diagram before scan insertion.

FIG. 1A shows an example of a general logic circuit particularly including a part configured of registers for shifting data, representing a schematic circuit diagram before scan insertion. As opposed to this, FIG. 1B shows the general logic circuit as shown in FIG. 1A including a scan path in which scan insertion is structured by conventional scan designs.

Figure 1B:
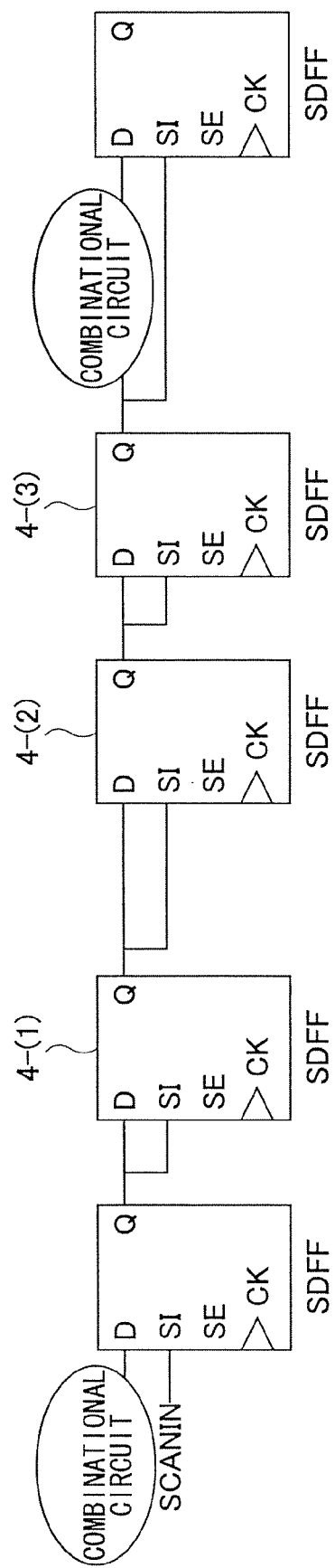
FIG. 1B shows the general logic circuit as shown in FIG. 1A including a scan path in which scan insertion is structured by conventional scan designs.

In the circuit as shown in FIG. 1B, a scan shift operation and a capture operation relative to both D input and SI input are the same in scan cells 4-(1), 4-(2), and 4-(3). In other words, the circuit as shown in FIG. 1B has a redundant circuit configuration.

FIG. 1C shows an example logic circuit diagram designed by a semiconductor integrated circuit designing method (manufacturing method) according to a first embodiment of the present invention. FIG. 1C is made by structuring a scan path in the logic circuit as shown in FIG. 1A, but it has flip-flops 6-(1), 6-(2), and 6-(3) as they are (see FIG. 1B). Note, however, that the circuit parts only right after combinational circuits are replaced by scan cells. The circuits as shown in FIGS. 1C and 1B perform the same operation both in a scan shift operation and a normal (capture) operation. Note that the combinational circuit refers to a circuit part composed of a logic gate (such as AND and OR) other than a flip flop, a buffer, and an inverter.

As described above, the semiconductor integrated circuit according to the first embodiment of the present invention uses the circuit parts, in which the normal operation and the scan shift operation become equivalent to each other, for the scan path as they are.

Second Embodiment

Figure 2A:
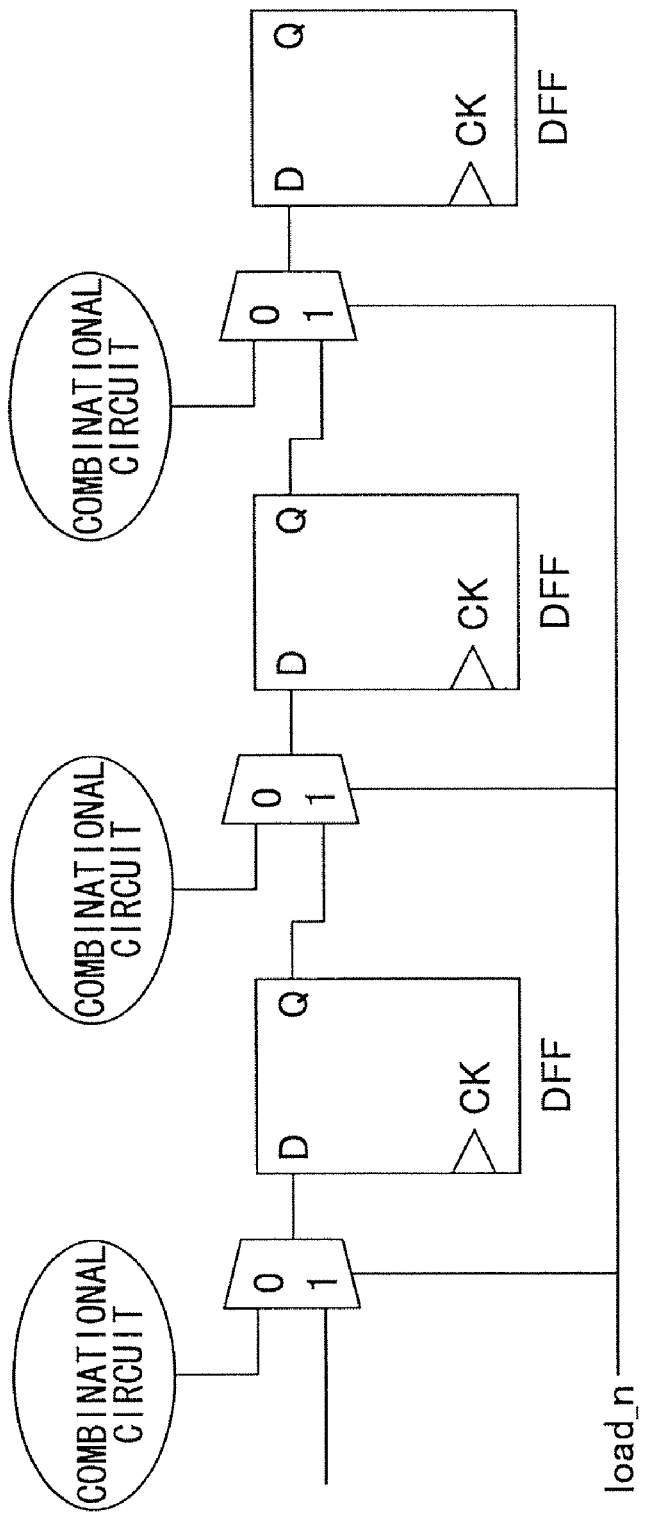
FIG. 2A shows an example of a general purpose parallel/serial conversion circuit.

FIG. 2A shows an example of a general purpose parallel/serial conversion circuit. Here, if a "load_n" signal is "0," data from combinational circuits are loaded in respective registers. If the "load_n" signal is "1," the data loaded in the respective registers are shifted.

Figure 2B:
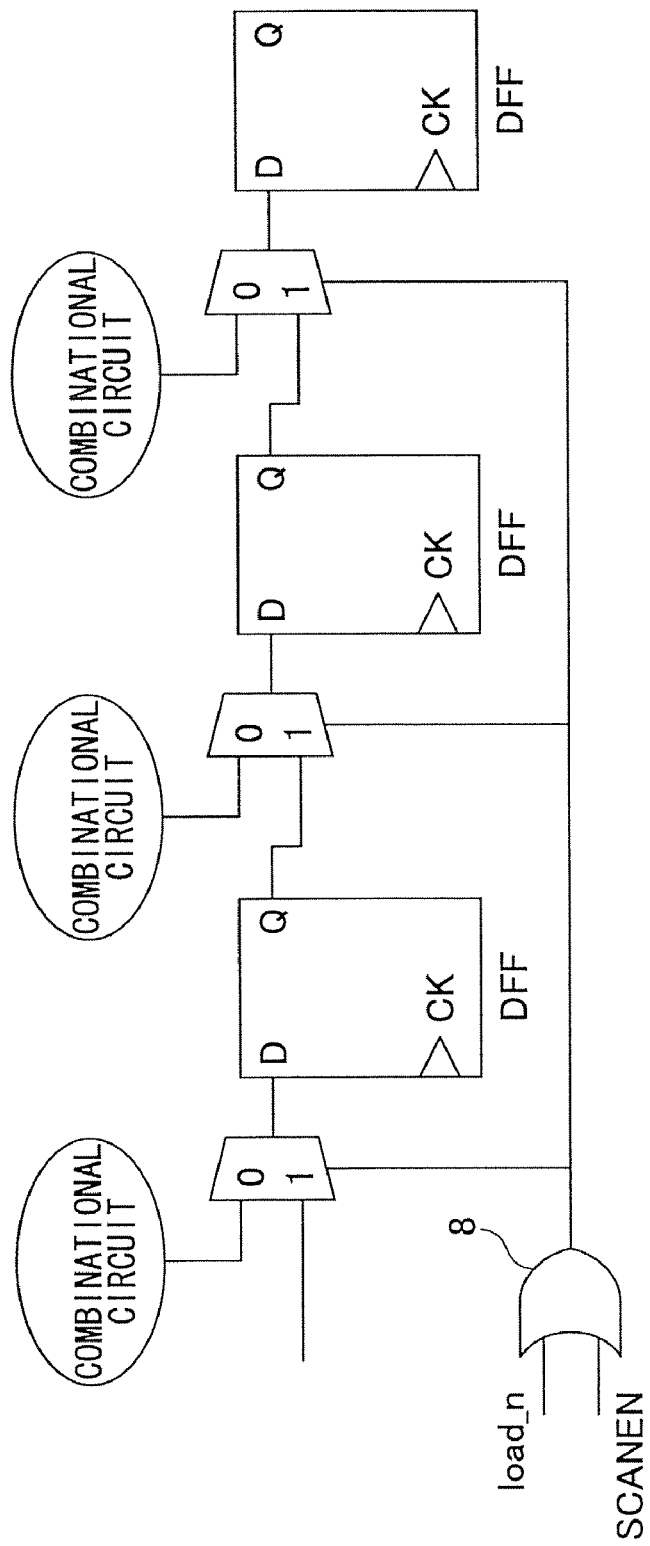
FIG. 2B shows an example circuit diagram of a parallel/serial conversion circuit designed by a semiconductor integrated circuit designing method (manufacturing method) according to a second embodiment of the present invention.

As opposed to this, FIG. 2B shows an example circuit diagram of a parallel/serial conversion circuit designed by a semiconductor integrated circuit designing method (manufacturing method) according to a second embodiment of the present invention. The circuit as shown in FIG. 2B is made by inserting a control circuit 8 in the circuit as shown in FIG. 2A. The control circuit 8 takes an OR of a "load_n" signal and a scan enable signal SCANEN. Then, if the SCANEN is "0," the parallel/serial conversion circuit operates normally. If the SCANEN is "1," the parallel/serial conversion circuit performs a data shift operation. Thus, the circuit as shown in FIG. 2B is capable of performing a scan operation and the SCANEN of the control circuit 8 is a signal for controlling the scan operation.

With the provision of the control circuit 8, the parallel/serial conversion circuit as shown in FIG. 2A is formed into the circuit as shown in FIG. 2B, thereby making it possible to provide a functional equivalent to the scan path and incorporate the sequence circuit parts of the flip-flops as shown in FIG. 2A in the scan path as they are.

Third Embodiment

Figure 3:
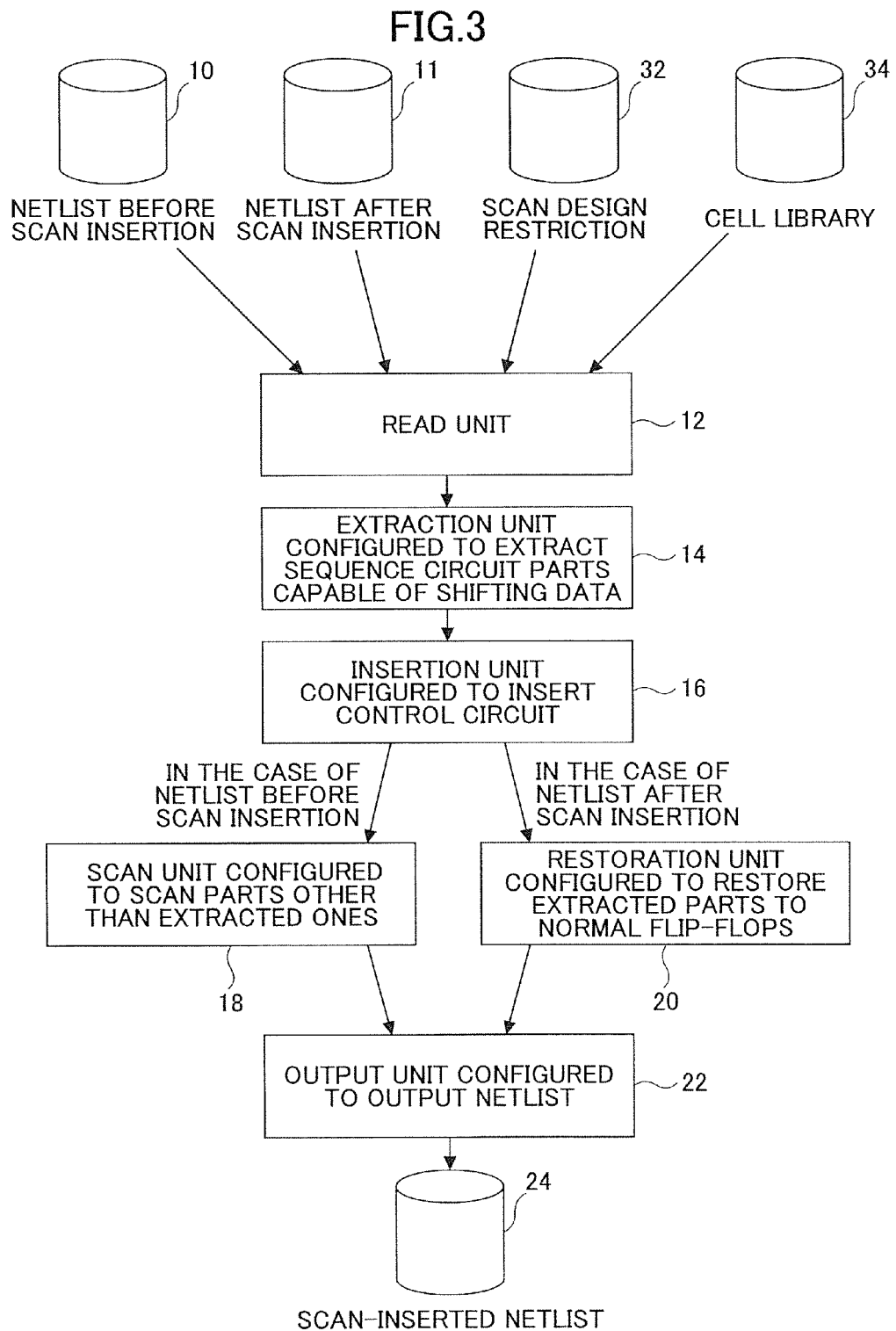
FIG. 3 shows a block diagram of a semiconductor integrated circuit design support device according to a third embodiment of the present invention.

FIG. 3 shows a block diagram of a semiconductor integrated circuit design support device according to a third embodiment of the present invention. The respective units as described below constituting the semiconductor integrated circuit design support device according to the third embodiment are preferably realized by the installation of suitable programs in a suitable computer. Furthermore, data to be used or generated in the respective units constituting the device are preferably stored in various memories or storage media attached to the computer.

(1) Netlist Processing Before Scan Insertion

At the beginning, a description is made of processing by the semiconductor integrated circuit design support device relative to a netlist 10 before scan insertion. First, a read unit 12 reads the netlist 10 before scan insertion.

Then, an extraction unit 14 for extracting sequence circuit parts capable of shifting data extracts circuit parts that can similarly perform the normal operation and the scan shift operation as shown in FIGS. 1A and 2A.

Then, an insertion unit 16 for inserting a control circuit inserts the control circuit 8 as shown in FIG. 2B.

Then, a scan unit 18 for scanning parts other than the extracted ones scans other sequence circuit parts, while maintaining the circuit parts extracted by the extraction unit 14, thereby structuring a scan path in such a manner as to maintain a user logic circuit.

Finally, an output unit 22 for outputting a netlist outputs the netlist so as to be stored.

(2) Netlist Processing After Scan Insertion

Subsequently, a description is made of processing by the semiconductor integrated circuit design support device relative to a netlist 11 after scan insertion. First, the read unit 12 reads the netlist 11 after scan insertion.

Then, the extraction unit 14 for extracting sequence circuit parts capable of shifting data extracts circuit parts that can similarly perform the normal operation and the scan shift operation as shown in FIGS. 1A and 2A.

Then, the insertion unit 16 for inserting a control circuit inserts the control circuit 8 as shown in FIG. 2B.

Then, a restoration unit 20 for restoring extracted parts to normal flip-flops restores the scan cells of the circuit parts extracted by the extraction unit 14 to normal flip-flops, thereby structuring a scan path in such a manner as to maintain a user logic circuit.

Finally, the output unit 22 for outputting a netlist outputs the netlist so as to be stored.

Fourth Embodiment

A semiconductor integrated circuit design support device according to a fourth embodiment of the present invention is substantially the same as that according to the third embodiment of the present invention. However, "an extraction unit configured to extract the longest path for shifting data in a netlist" is further added. Here, the path includes not only parts for shifting data, but also an inverting logic part such as an inverter.

Figure 4:
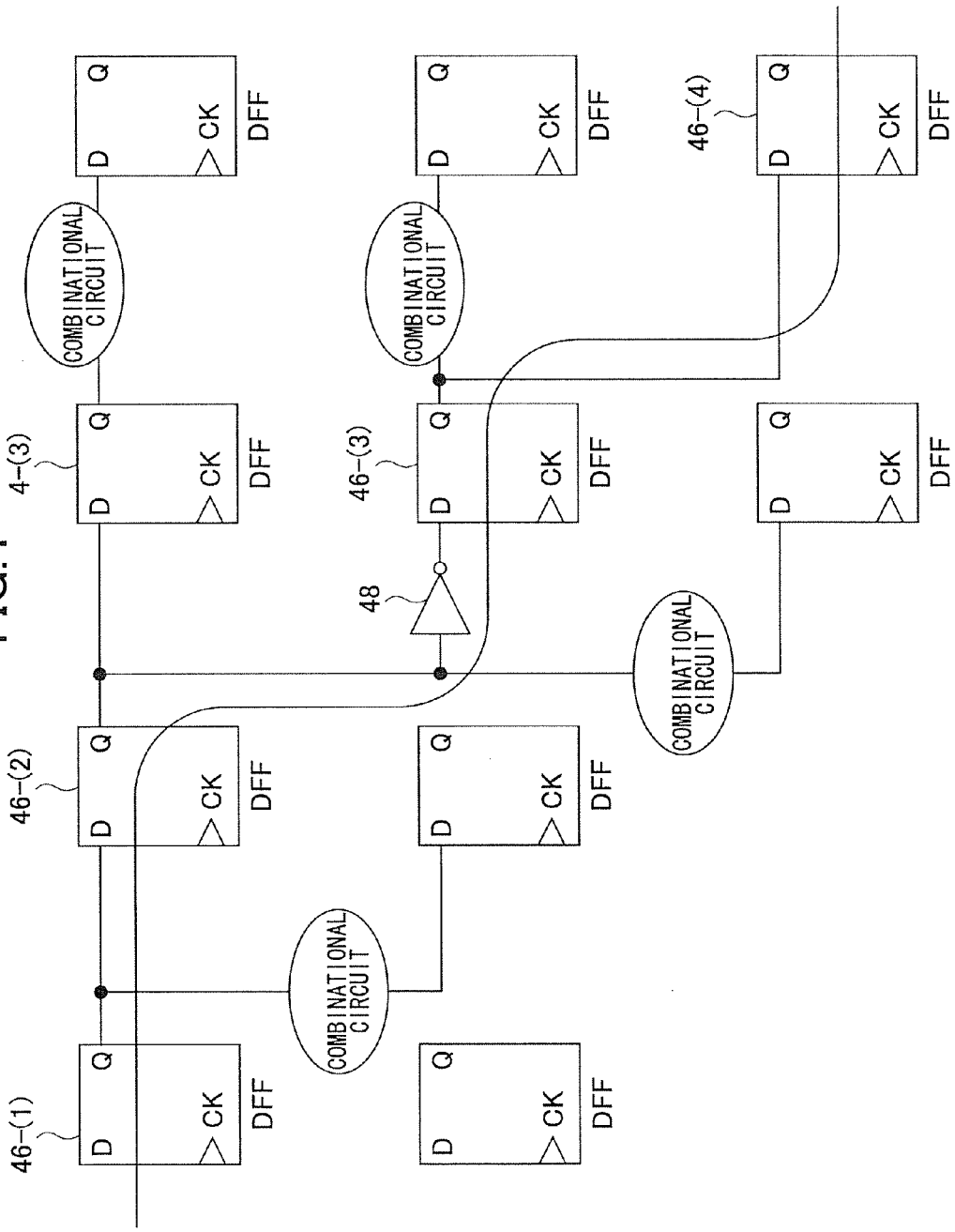
FIG. 4 shows a circuit diagram of sequence circuits before the structure of a scan path for indicating a processing example by a semiconductor integrated circuit design support device according to a fourth embodiment of the present invention.

A description is now made of processing by the semiconductor integrated circuit design support device according to the fourth embodiment by using an example of sequence circuits before the structuring of a scan path as shown in FIG. 4.

In the case of a data shift operation using a flip-flop 46-(1) as a starting point, the path passing through the flip-flops 46-(1), 46-(2), 46-(3), and 46-(4) becomes the longest one capable of shifting data as shown in FIG. 4. Even if the inverter 48 is present in the middle of the path, it will not influence a scan shift operation. Therefore, the parts for shifting data including the inverting logic part are extracted.

As a procedure for extracting the parts for shifting data, attention is paid to the D input of the flip-flop 46-(4). Specifically, a path in which the logic cone to the D input makes a pair, or a path including the inverting logic part, is extracted. As a result, the flip-flop 46-(3) is found. Next, attention is paid to the D input of the flip-flop 46-(3). Similarly, a path in which the logic cone to the D input makes a pair, or a path including the inverting logic part, is extracted.

The above processing is repeated to extract the longest path capable of shifting data. The extracted path can be directly used as a scan path. Moreover, flip-flops other than the flip-flops 46-(1), 46-(2), 46-(3), and 46-(4) are made into scan cells.

The present invention is not limited to the specifically disclosed embodiment, and variations and modifications may be made without departing from the scope of the present invention.

The present application is based on Japanese Priority Patent Application No. 2007-058884, filed on Mar. 8, 2007, the entire contents of which are hereby incorporated by reference.

What is claimed is:

1. A semiconductor integrated circuit manufacturing method, comprising:

reading netlist data;

extracting a sequence circuit part capable of shifting data, including extracting from the read netlist data the sequence circuit part capable of performing a normal operation and a scan operation;

inserting a control circuit that causes the extracted sequence circuit part capable of shifting data to perform the scan operation;

making other sequence circuit parts in the read netlist data into scan cells while maintaining the extracted sequence circuit part capable of shifting data if the netlist data read by the read unit are data before insertion of the scan cells, thereby structuring a scan path while maintaining a logic circuit;

restoring all or a part of the extracted sequence circuit parts capable of shifting data to flip-flops if the netlist data read by the read unit are data after the insertion of the scan cells, thereby structuring the scan path such that it minimizes a physical area necessary in the semiconductor integrated circuit while maintaining the logic circuit; and outputting the netlist data.

2. The semiconductor integrated circuit manufacturing method according to claim 1, wherein the step of extracting the circuit part capable of shifting data includes extracting a longest path for shifting data in a netlist.

3. A semiconductor integrated circuit design support device, comprising:

a read unit configured to read netlist data;

an extraction unit configured to extract a sequence circuit part capable of shifting data, the extraction unit extracting from the read netlist data the sequence circuit part capable of similarly performing a normal operation and a scan operation;

an insertion unit configured to insert a control circuit that causes the extracted sequence circuit part capable of shifting data to perform the scan operation;

a first unit configured to make other sequence circuit parts in the read netlist data into scan cells while maintaining the extracted sequence circuit part capable of shifting data if the netlist data read by the read unit are data before insertion of the scan cells, thereby structuring a scan path while maintaining a user logic circuit;

a second scan unit configured to restore all or a part of the extracted sequence circuit parts capable of shifting data to flip-flops if the netlist data read by the read unit are data after the insertion of the scan cells, thereby structuring the scan path while maintaining the user logic circuit; and an output unit configured to output the netlist data.

4. The semiconductor integrated circuit design support device according to claim 3, wherein the extraction unit configured to extract the sequence circuit part capable of shifting data includes a longest-path extraction unit configured to extract a longest path for shifting data in a netlist.

5. The semiconductor integrated circuit manufacturing method according to claim 1, further comprising: during the step of making other sequence circuit parts in the read netlist data into scan cells, replacing only the circuit parts located right after combinational circuits with scan cells.

* * * * *